United States Patent [19]
Kim

[11] Patent Number: 5,184,087
[45] Date of Patent: Feb. 2, 1993

[54] TRANSCONDUCTANCE AMPLIFIER USING PARASITIC BIPOLAR TRANSISTORS TO EMBODY A CONSTANT VOLTAGE SOURCE

[75] Inventor: Cheong W. Kim, Kyungki-Do, Rep. of Korea

[73] Assignee: Goldstar Electron Co., Ltd., Choongchungbook-Do, Rep. of Korea

[21] Appl. No.: 813,626

[22] Filed: Dec. 26, 1991

[30] Foreign Application Priority Data

Mar. 30, 1991 [KR] Rep. of Korea ............... 4308/1991

[51] Int. Cl.[5] ........................... H03F 3/45; H03F 3/16
[52] U.S. Cl. ................................. 330/253; 330/300
[58] Field of Search ............ 330/253, 257, 261, 277, 330/288, 296, 300

[56] References Cited

U.S. PATENT DOCUMENTS 5,089,789  2/1992  Van Tran ........................... 330/253
5,101,126  3/1992  Butler et al. ...................... 330/300 X Primary Examiner—Steven Mottola
Attorney, Agent, or Firm—Lowe, Price, LeBlanc & Becker

[57] ABSTRACT

A transconductance amplifier comprising an active load including current mirrors, an amplifying unit provided with a pair of first and second NMOS transistors and a bias unit provided with a pair of parasitic bipolar transistors. The parasitic bipolar transistors may be vertical or horizontal-type bipolar transistors that are present in fabrication of CMOS devices. In accordance with the present invention, the transconductance amplifier is capable of embodying a constant voltage source thereof utilizing the parasitic bipolar transistors which are present in fabrication of CMOS devices thereof. The constant voltage source applies a constant voltage between the gates of the first and second NMOS transistors. Therefore, the number of components constituting the circuit can be reduced with the stability of the circuit being superior to that of the conventional circuit comprising only the MOS transistors.

5 Claims, 3 Drawing Sheets

TRANSCONDUCTANCE AMPLIFIER USING PARASITIC BIPOLAR TRANSISTORS TO EMBODY A CONSTANT VOLTAGE SOURCE

BACKGROUND OF THE INVENTION

1. Field of the Invention

The present invention relates in general to a transconductance amplifier for suppling an output current which is proportional to a signal voltage, and more particularly, to a transconductance amplifier for embodying a constant voltage source that utilizes parasitic bipolar transistors which are present in the fabrication of CMOS devices so that the circuit can have a reduced number of components and improved electric characteristics.

2. Description of the Prior Art

With reference to FIG. 1, there is shown a circuit diagram of a basic construction of a conventional transconductance amplifier for explanation of the fundamental principles of the amplifier. The illustrated transconductance amplifier comprises an active load 1, and a pair of NMOS transistors NM1 and NM2 including their gate terminals connected respectively to positive/negative input signal terminals Vin+ and Vin−, their source terminals connected respectively to cathode terminals of bias voltage sources $V_B'$ and $V_B$, anode terminals of which are connected respectively between the negative input signal terminal Vin− and the gate of the NMOS transistor NM2 and between the positive input signal terminal Vin+ and the gate of the NMOS transistor NM1, and their drain terminals connected to the active load 1. Also, a current output terminal Iout is connected between the active load 1 and the drain terminal of the NMOS transistor NM2.

The operation of the conventional transconductance amplifier with the above-mentioned basic construction will now be described.

If the drain currents of the NMOS transistors NM1 and NM2 are designated respectively as $I_{D1}$ and $I_{D2}$, they can be expressed as follows:

$$I_{D1} = K1(V_B + Vin/2 - V_T)^2 \quad (1)$$

$$I_{D2} = K2(V_B - Vin/w - V_T)^2 \quad (2)$$

where K1 and K2 are transconductance constants of the NMOS transistors NM1 and NM2 and $V_T$ is a threshold voltage.

Supposing that the NMOS transistors NM1 and NM2 are the same in size, the relationship between the transconductance constants thereof is established as K1=K2=K and thus the following equation (3) is obtained:

$$Iout = I_{D1} - I_{D2} = K(V_D - V_T)Vin \quad (3)$$

where $V_D$ is a drain voltage of the NMOS transistors NM1 and NM2.

Therefore, a circuit meeting the above equation (3) can embody the basic construction of the transconductance amplifier.

With reference to FIG. 2, there is shown a circuit diagram of an embodiment of the conventional transconductance amplifier. In this drawing, the conventional transconductance amplifier comprises an active load 1, an amplifying section 2 and a bias section 3.

The amplifying section 2 is provided with a pair of NMOS transistors NM1 and NM2 including their gate terminals connected respectively to positive/negative input signal terminals Vin+ and Vin−, their drain terminals connected to the active load 1 and their source terminals connected respectively to bias supplying terminals of the bias section 3. Also, a current output terminal Iout is connected between the active load 1 and the drain terminal of the NMOS transistor NM2.

On the other hand, the bias section 3 is provided with a pair of NMOS transistors NM3 and NM4 including their gate terminals connected respectively to the positive/negative input signal terminals Vin+ and Vin−, their drain terminals connected to a voltage source terminal $V_{DD}$ and their source terminals connected respectively to the source terminals of the NMOS transistors NM2 and NM1 in the amplifying section 2. Also, current sources Is1 and Is2 are connected respectively between the the source terminal of the NMOS transistor NM3 and a ground terminal and between the source terminal of the NMOS transistor NM4 and the ground terminal.

With reference to FIG. 3, there is shown a circuit diagram of an alternative embodiment of the conventional transconductance amplifier. In this drawing, the conventional transconductance amplifier comprises an amplifying section 2', a bias section 3' and a current output section 4.

The amplifying section 2' is provided with a pair of NMOS transistors NM1 and NM2 including their gate terminals connected respectively to positive/negative input signal terminals Vin+ and Vin−, their source terminals connected respectively to bias supplying terminals of the bias section 3'.

Also, the bias section 3' is provided with a pair of NMOS transistors NM3 and NM4 including their gate terminals connected respectively to the positive/negative input signal terminals Vin+ and Vin−, PMOS transistors PM1, PM2, PM3 and PM4 including their source terminals connected to the voltage source terminal $V_{DD}$, and NMOS transistor NM5, NM6, NM7 and NM8 including their source terminals connected to a ground terminal. Drain terminals of the NMOS transistors NM3 and NM4 are connected respectively to common gate terminals of the PMOS transistors PM1 and PM2 and common gate terminals of the PMOS transistors PM3 and PM4, and respectively to drain terminals of the PMOS transistors PM2 and PM3. Source terminals of the NMOS transistors NM3 and NM4 connected respectively to the source terminals of the NMOS transistors NM2 and NM1 in the amplifying section 2', and respectively to drain terminals of the NMOS transistors NM6 and NM7. Also, current sources Is1 and Is2 are connected respectively between the source terminal of the NMOS transistor NM3 and the ground terminal and between the source terminal of the NMOS transistor NM4 and the ground terminal. On the other hand, drain terminals of the PMOS transistors PM1 and PM4 are connected respectively to drain terminals of the NMOS transistors NM5 and NM8, and respectively to common gate terminals of the NMOS transistors NM5 and NM6 and common gate terminals of the NMOS transistors NM7 and NM8.

On the other hand, the current output section 4 is provided with a PMOS transistor PM5 including its gate terminal connected to the common gate terminals of the PMOS transistors PM3 and PM4 in the bias section 3' and its source terminal connected to the voltage source terminal $V_{DD}$, and an NMOS transistor NM9 including its gate terminal connected to the common gate terminal of the NMOS transistors NM5 and NM6 in the bias section 3', its source terminal connected to the ground terminal and its drain terminal connected to drain terminal of the PMOS transistor PM5. Also, a current output terminal Iout is connected to the common drain terminal of the PMOS transistor PM5 and the NMOS transistor NM9.

The operation of the conventional transconductance amplifier with the above-mentioned construction with reference to FIG. 2 is substantially the same as that of the basic construction described with reference to FIG. 1, with the exception that the NMOS transistors NM3 and NM4 in the bias section 3 are large in size and the current from the current sources (Is1=Is2) are large in value, for the purpose of embodying the bias voltage sources $V_B$ and $V_B'$ for applying the bias voltages respectively between the gate terminals of the NMOS transistors NM1 and NM2 and the source terminals of the NMOS transistors NM2 and NM1, as shown in FIG. 1.

On the other hand, in the alternative embodiment of the conventional transconductance amplifier described with reference to FIG. 3, feedback circuits of current mirror constructions are used to compensate the currents flowing between the drain terminals and the source terminals of the NMOS transistors NM3 and NM4 in the bias section 3'. Namely, the MOS transistors PM1, PM2, NM5 and NM6 and the MOS transistors PM3, PM4, NM7 and NM8 in the bias section 3' constitute respective current mirrors which are driven respectively by the NMOS transistors NM3 and NM4. As a result, the drain currents of the NMOS transistors NM3 and NM4 are fed back to the source terminals thereof, resulting in supplying the bias voltages respectively to the source terminals of the NMOS transistors NM2 and NM1 in the amplifying section 2'. Thus, the NMOS transistors NM3 and NM4 operate as constant voltage sources to the NMOS transistors NM2 and NM1. In the current output section 4, a mirror current difference is outputted through the current output terminal Iout which is based on the positive/negative input signals Vin+ and Vin− flowing through the bias section 3', due to the respective connections of the gates of the MOS transistors PM5 and NM9 with the common gates of the current mirror MOS transistors PM3, PM4, NM5 and NM6 in the bias section 3'.

However, the conventional transconductance amplifier has a disadvantage in that the chip is limited in size, since the NMOS transistors NM3 and NM4 in the bias section 3 must be large in size and the current from the current sources (Is1=Is2) must be large in value as described with reference to FIG. 2. Namely, the limitation in the size of the chip has a bad effect on the high integration of the chip. Also, the conventional transconductance amplifier has another disadvantage in that a multiplicity of devices are used to constitute the current mirror circuits, by which the bias voltages are supplied as the constant voltages, as described with reference to FIG. 3. That is, the use of the multiplicity of devices results in an increase in price and a degradation in precision, i.e., deterioration in electric characteristics and reduction in reliability.

SUMMARY OF THE INVENTION

Therefore, it is an object of the present invention to provide a transconductance amplifier for embodying a constant voltage source thereof utilizing parasitic bipolar transistors which are present in fabrication of CMOS devices thereof, so that components constituting the circuit can be reduced in number and its electric characteristics can be improved.

In accordance with the present invention, the above object can be accomplished by the provision of transconductance amplifier, comprising, an active load including current mirrors, amplifying unit provided with a pair of first and second NMOS transistors including their gate terminals connected respectively to positive and negative input signal terminals and their drain terminals connected to the active load, the drain terminal of the second NMOS transistor being also connected to a current output terminal. The amplifier also comprises a bias unit provided with a pair of third and fourth NMOS transistors including their gate terminal connected respectively to the positive and negative input signal terminals and their drain terminals connected to a voltage source terminal, a pair terminals connected to a voltage source terminal and a pair of fifth and sixth NMOS transistors including their gate terminals connected commonly to a bias voltage source terminal, their source terminals connected to a ground terminal and their drain terminals connected respectively to source terminals of the third and fourth NMOS transistors. The amplifier also comprises and a pair of first and second parasitic bipolar transistors including their base terminals connected respectively to the source terminals of the third and fourth NMOS transistors, their collector terminals connected to the voltage source terminal and their emitter terminals connected respectively to source terminals of the second and first NMOS transistors in the amplifying unit and to the ground terminal respectively through first and second current sources.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Figure 1:
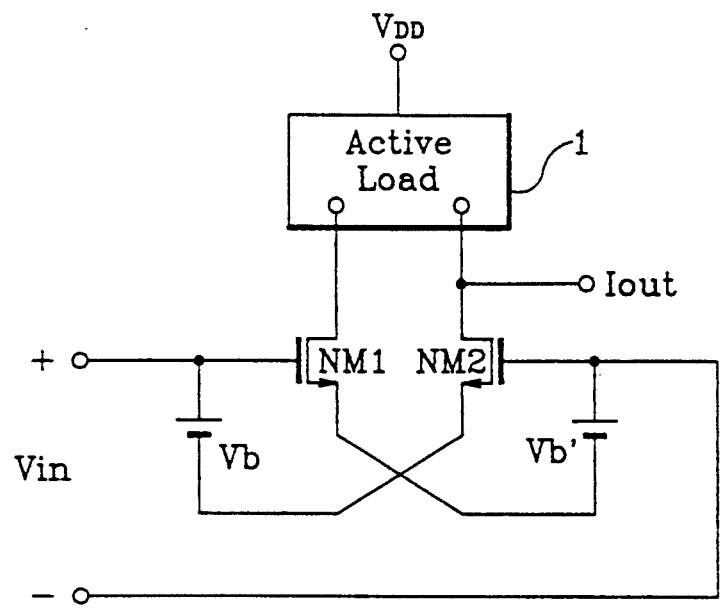
FIG. 1 is a circuit diagram of a basic construction of a conventional transconductance amplifier for explanation of the fundamental principles of the amplifier.
Figure 2:
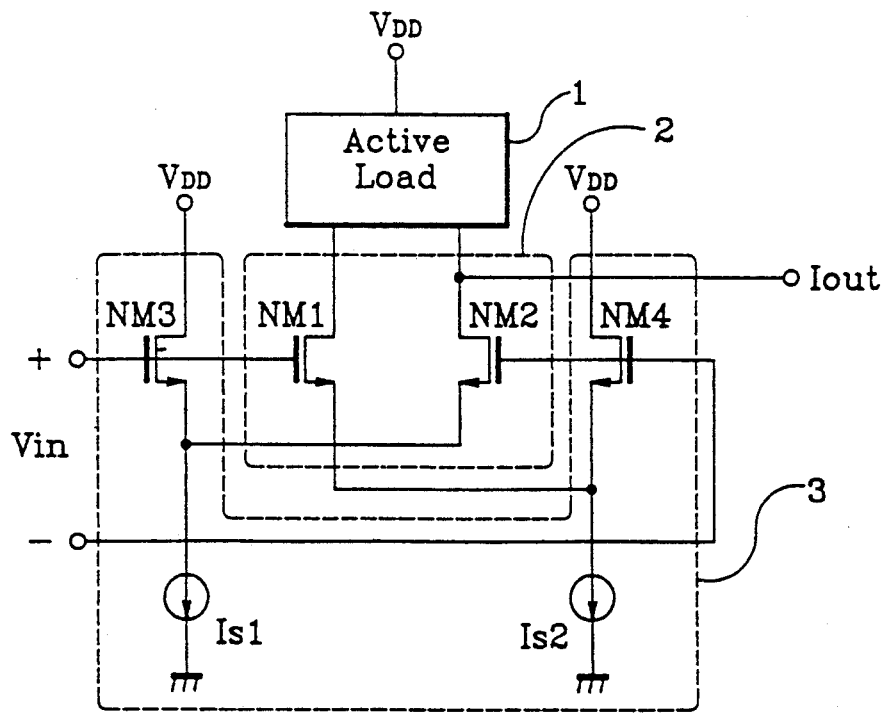
FIG. 2 is a circuit diagram of an embodiment of the conventional transconductance amplifier.
Figure 3:
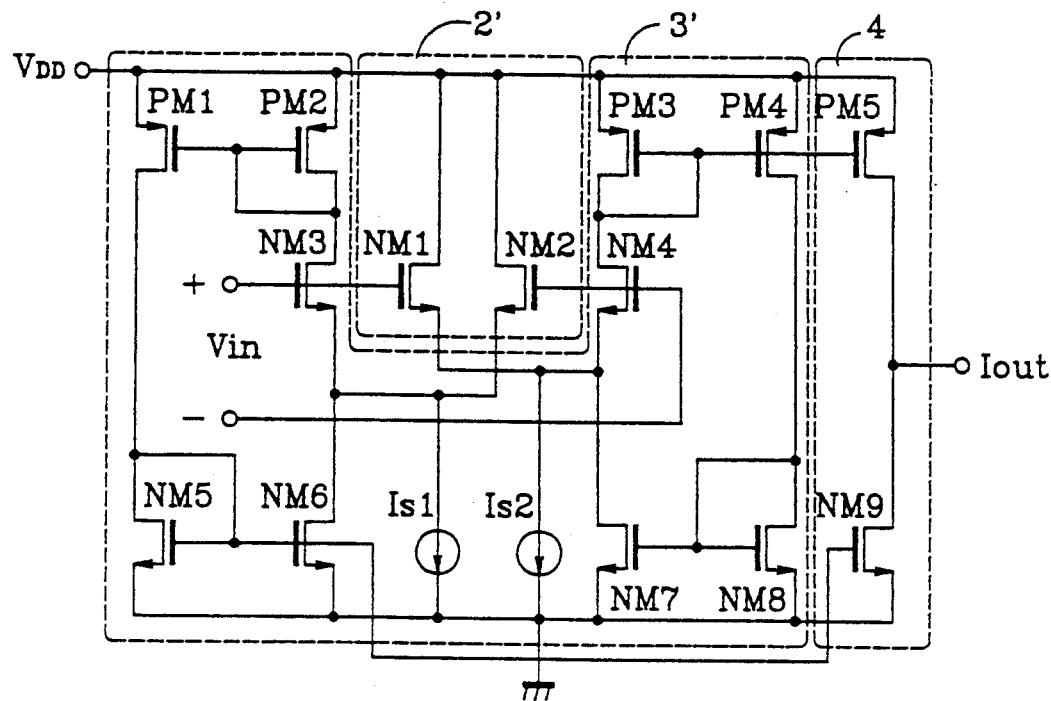
FIG. 3 is a circuit diagram of an alternative embodiment of the conventional transconductance amplifier.
Figure 4:
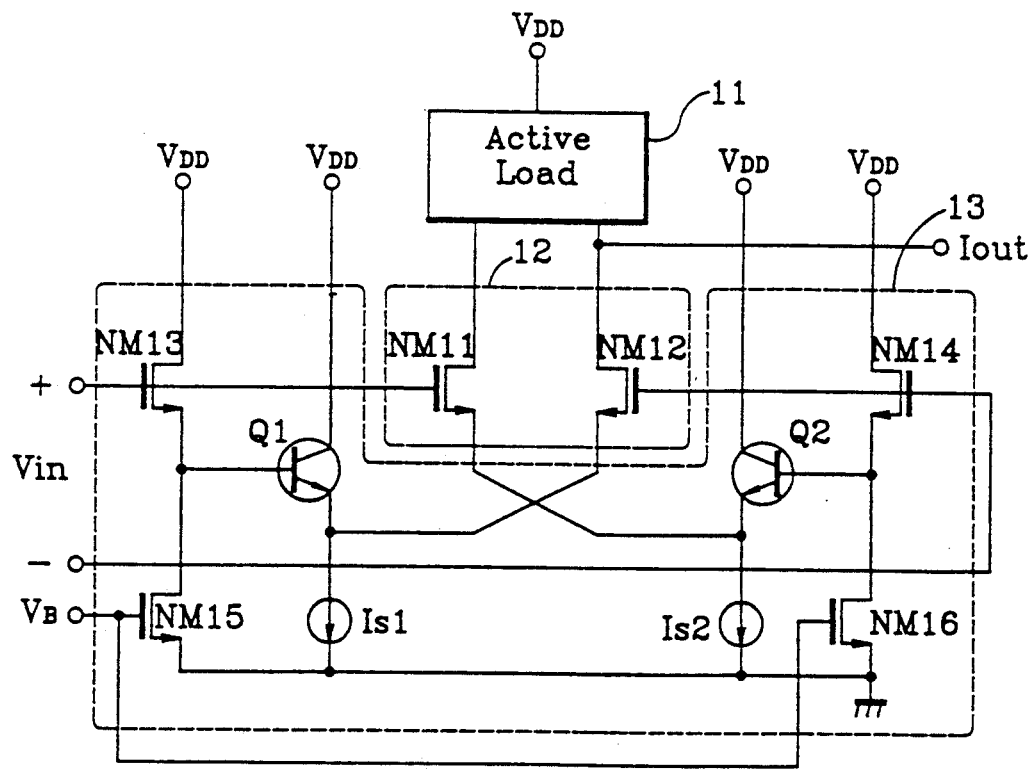
FIG. 4 is a circuit diagram of an embodiment of a transconductance amplifier of the present invention.

With reference to FIG. 4, there is shown a circuit diagram of an embodiment of a transconductance amplifier of the present invention. As shown in this drawing, the transconductance amplifier of the present invention comprises an active load 11, an amplifying section 12 and a bias section 13.

The amplifying section 12 is provided with a pair of NMOS transistors NM11 and NM12 including their gate terminals connected respectively to positive and negative input signal terminals Vin+ and Vin−, their source terminals connected respectively to constant voltage supplying terminals of the bias section 13. Also, a current output terminal Iout is connected between the active load 11 and the drain terminal of the NMOS transistor NM12.

On the other hand, the bias section 13 is provided with a pair of NMOS transistors NM13 and NM14 including their gate terminals connected respectively to the positive and negative input signal terminals Vin+ and Vin− and their drain terminals connected to a voltage source terminal $V_{DD}$, a pair of NMOS transistors NM15 and NM16 including their gate terminals connected commonly to bias voltage source terminal $V_B$, their source terminals connected to a ground terminal and their drain terminals connected respectively to source terminals of the NMOS transistors NM13 and NM14, and a pair of parasitic bipolar transistors Q1 and Q2 including their base terminals connected respectively to the source terminals of the NMOS transistors NM13 and NM14, their collector terminals connected to the voltage source terminal $V_{DD}$ and their emitter terminals connected respectively to the source terminals of the NMOS transistors NM12 and and NM11 in the amplifying section 12. Also, current sources Is1 and Is2 are connected respectively between the emitter terminal of the parasitic bipolar transistor Q1 and the ground terminal, and between the emitter terminal of the parasitic bipolar transistor Q2 and the ground terminal.

Herein, the parasitic bipolar transistors Q1 and Q2 are present in fabrication of CMOS devices. More particularly, the parasitic bipolar transistors Q1 and Q2 may be, for example, vertical-type bipolar transistors, in which wells are used as the bases, substrates are used as the collectors, and sources or drains of MOS transistors are used as the emitters. Also, the parasitic bipolar transistors Q1 and Q2 may be horizontal-type bipolar transistors, in which wells are used as the bases, sources of MOS trzansistors are used as the emitters, and drains of MOS transistors are used as the collectors.

Figure 5:
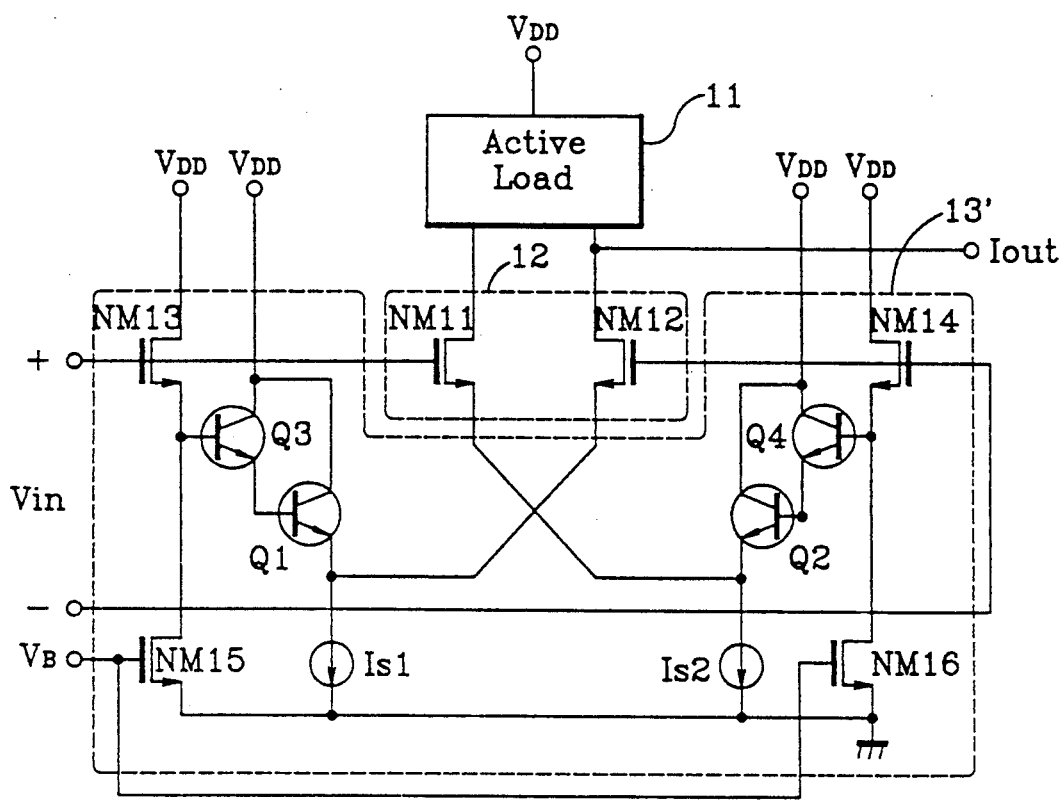
FIG. 5 is a circuit diagram of an alternative embodiment of the transconductance amplifier of the present invention.

With reference to FIG. 5, there is shown a circuit diagram of an alternative embodiment of the transconductance amplifier of the present invention. The construction of the transconductance amplifier in this drawing is substantially the same as that described with reference to FIG. 4, with the exception that two-stage parasitic bipolar transistors are included in a bias section 13', instead of single-stage parasitic bipolar transistors. Specifically, the bias section 13' in FIG. 5 is provided with further parasitic bipolar transistors Q3 and Q4, in addition to the parasitic bipolar transistors Q1 and Q2 and the NMOS transistors NM13, NM14, NM15 and NM16 in FIG. 4. Base terminals of the parasitic bipolar transistors Q3 and Q4 are connected respectively to connection of the source terminal of the NMOS transistor NM13 with the drain terminal of the NMOS transistor NM15 and to connection of the source terminal of the NMOS transistor NM14 with the drain terminal of the NMOS transistor NM16, collector terminals thereof are connected to the voltage source terminal $V_{DD}$, and emitter terminals thereof are connected respectively to the base terminals of the parasitic bipolar transistors Q1 and Q2. Herein, the same parts are designated by the same reference numerals, respectively.

Figure 6:
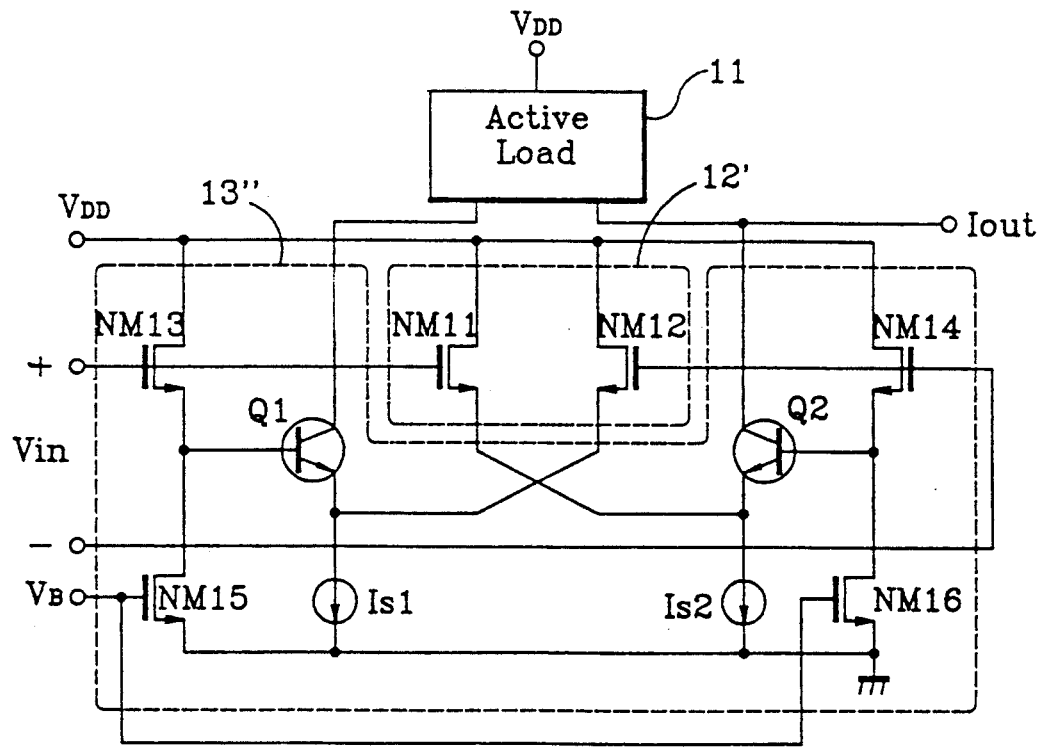
FIG. 6 is a circuit diagram of another embodiment of the transconductance amplifier of the present invention.

With reference to FIG. 6, there is shown a circuit diagram of another embodiment of the transconductance amplifier of the present invention. The construction of the transconductance amplifier in this drawing is substantially the same as that described with reference to FIG. 4, with the exception that the collector terminals of the parasitic bipolar transistors Q1 and Q2 in a bias section 13" are connected to the active load 11, the drain terminals of the NMOS transistors NM11 and NM12 in an amplifying section 12' are connected to the voltage source terminal $V_{DD}$ and the current output terminal Iout is connected to connection of the collector terminal of the parasitic bipolar transistor Q2 with the active load 11. Herein, the same parts are designated by the same reference numerals, respectively.

The operation of the transconductance amplifier with the abovementioned construction in accordance with the present invention will now be described in detail.

First, if the DC source voltage is applied to the voltage source terminal $V_{DD}$, the input voltage Vin is applied to the positive and negative input signal terminals Vin+ and Vin− and a constant level of the bias voltage is applied to the bias voltage source terminal $V_B$, saturations of the NMOS transistors NM11 and NM12 in the amplifying section 12 and the NMOS transistors NM13 and NM14 in the bias section 13 are controlled by the input voltage Vin. As a result, respective amounts of currents flowing therethrough are determined. At this time, since all NMOS transistors NM11 through NM16 operate in saturation regions, gate-source voltages $V_{GS.NM15}$ and $V_{GS.NM16}$ of the NMOS transistors NM15 and NM16 become the bias voltage $V_B$. In result, the gate-source voltages $V_{GS.NM15}$ and $V_{GS.NM16}$ of the NMOS transistors NM15 and NM16 appear as gate-source voltages $V_{GS.NM13}$ and $V_{GS.NM14}$ of the NMOS transistors NM13 and NM14.

Namely, $$V_{GS.NM13} = V_{GS.NM15} = V_B \qquad (4)$$
$$V_{GS.NM14} = V_{GS.NM16} = V_B$$

Therefore, amounts of the currents flowing through the NMOS transistors NM11 and NM12 are determined by the input voltage Vin. The residual currents, which are formed by subtracting amounts of the currents through the NMOS transistors NM12 and NM11 respectively from amounts of the currents from the current sources Is1 and Is2, flow respectively through the parasitic bipolar transistors Q1 and Q2. The currents flowing through the NMOS transistors NM11 and NM12 appear as the output current Iout by the active load 11 which is provided with the current mirrors. The output current Iout is defined as follows:

$$Iout = I_{D11} - I_{D12}$$

where $I_{D11}$ and $I_{D12}$ are drain currents of the NMOS transistors NM11 and NM12.

On the other hand, the parasitic bipolar transistors Q1 and Q2 may be vertical-type bipolar transistors or horizontal-type bipolar transistors which are present in fabrication of CMOS devices. Base-emitter voltage $V_{BE}$ of the parasitic bipolar transistor is defined as follows:

$$V_{BE} = V_T \ln(Ic/Is) \qquad (5)$$

where $V_T$ is a threshold voltage, Ic is a collector current and Is is a reverse saturation current.

The base-emitter voltage $V_{BE}$ of the parasitic bipolar transistor varies logarithmically with respect to the collector current Ic, while the gate-source voltage $V_{GS}$ of the MOS transistor is defined as follows:

$$V_{GS} = \sqrt{(I_D/K)} + V_T \quad (6)$$

where $I_D$ is a drain current, K is a transconductance constant and $V_T$ is a threshold voltage.

From the equation (6), it can be seen that the gate-source voltage $V_{GS}$ of the MOS transistor varies exponentially with respect to the drain current $I_D$.

Therefore, from the equations (5) and (6), it can be seen that the variation of the base-emitter voltage $V_{BE}$ of the parasitic bipolar transistor with respect to the variation of the collector current Ic may be neglected in comparison with the variation of the gate-source voltage $V_{GS}$ of the MOS transistor with respect to the variation of the drain current $I_D$. In other words, using the bipolar transistor as the constant voltage source allows the circuit to operate with more stability with respect to the variation of the source voltage $V_{DD}$ than that of the use of the MOS transistor.

Accordingly, the gate-source voltages $V_{GS.NM11}$ and $V_{GS.NM12}$ of the NMOS transistors NM11 and NM12 can be expressed by the following equations:

$$V_{GS.NM11} = V_{GS.NM14} + V_{BE.Q2} = V_B + V_{BE} = \text{constant} \quad (7)$$

$$V_{GS.NM12} = V_{GS.NM15} + V_{BE.Q1} = V_B + V_{BE} = \text{constant} \quad (8)$$

where it is supposed that $V_{BE}$ is as follows:

$$V_{BE.Q1} = V_{BE.Q2} = V_{BE}.$$

Also, the drain current $I_D$ of the MOS transistor is defined as follows:

$$I_D = K(V_{GS} - V_T)^2 \quad (9).$$

Using the equation (9), the drain current $I_{D11}$ and $I_{D12}$ of the NMOS transistors NM11 and NM12 can be obtained as follows:

$$I_{D11} = K11(V_B + V_{BE} - V_T + V_{in}/2)^2 \quad (10)$$

$$I_{D12} = K12(V_B + V_{BE} - V_T + V_{in}/2)^2 \quad (11).$$

Designing the NMOS transistors NM11 and NM12 such that their constructions are equal to each other and using the active load 11 which is provided with the current mirrors, the output current Iout can be obtained as follows:

$$I_{out} = I_{D11} - I_{D12}.$$

From the equations (10) and (11):

$$I_{out} = K(V_B + V_{BE} - V_t)V_{in} \quad (12)$$

where, since the NMOS transistors NM11 and NM12 are designed to equal to each other in construction, it is supposed that the transconductance constants are as follows:

$$K11 = K12 = K.$$

As a result, the output current Iout becomes proportional to the input voltage Vin and is determined in accordance with the proportional constant, or $K(V_B + V_{BE} - V_T)$. Varying the bias voltage $V_B$ being applied to the gates of the NMOS transistors NM15 and NM16 enables the variation in the proportional constant $K(V_B + V_{BE} - V_T)$ of the transconductance amplifier, thereby allowing the transconductance amplifier to be used as a voltage controlled transconductance amplifier.

In the alternative embodiment of the transconductance amplifier of the present invention described with reference to FIG. 5, the bias section 13' is provided with further parasitic bipolar transistors Q3 and Q4, in addition to the parasitic bipolar transistors Q1 and Q2 in FIG. 4. The purpose of the parasitic bipolar transistors Q3 and Q4 is to reduce the influence of the base currents of the parasitic bipolar transistors Q1 and Q2 when current amplification degrees of the bipolar transistors Q1 and Q2 are low or when the collector currents thereof are large in variation.

In another embodiment of the transconductance amplifier of the present invention described with reference to FIG. 6, the collectors of the parasitic bipolar transistors Q1 and Q2 are connected to the active load 11 such that the collector current of the bipolar transistor Q2 is outputted as the output current Iout. The purpose of this construction is to enlarge the range of the input voltage Vin.

As hereinbefore described, in accordance with the present invention, there is provided the transconductance amplifier for embodying a constant voltage source thereof utilizing parasitic bipolar transistors which are present in fabrication of CMOS devices thereof, so that components constituting the circuit can be reduced in number and stability of the circuit is superior to that of the conventional circuit comprising only the MOS transistors. Generally, the transconductance amplifier is mainly used in the case where an active filter is contained in the chip, this case necessitating an external control to a variation in process of fabrication of the chip. Therefore, the present invention can embody a voltage controlled transconductance amplifier by an external control of bias voltage, thereby allowing the amplifier to be applied to the case where a precision high frequency filter is contained in the chip.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A transconductance amplifier, comprising:
an active load including current mirrors;
amplifying means provided with a pair of first and second NMOS transistors including gate terminals connected respectively to positive and negative input signal terminals and drain terminals connected to said active load, the drain terminal of said second NMOS transistor being connected to a current output terminal; and
bias means provided with a pair of third and fourth NMOS transistors including gate terminals connected respectively to the positive and negative input signal terminals and drain terminals connected to a voltage source terminal, a pair of fifth and sixth NMOS transistors including gate terminals connected commonly to a bias voltage source terminal, source terminals connected to a ground terminal and drain terminals connected respectively to the source terminals of said third and fourth NMOS transistors, and a pair of first and second parasitic bipolar transistors including base terminals connected respectively to the source terminals of said third and fourth NMOS transistors, collector terminals connected to the voltage source terminal and emitter terminals connected respectively to source terminals of said second and first NMOS transistors in said amplifying means and to the ground terminal respectively through first and second current sources.

2. A transconductance amplifier as set forth in claim 1, wherein said first and second parasitic bipolar transistors are vertical-type parasitic bipolar transistors being present in fabrication of CMOS devices, in which wells are used as the bases, substrates are used as the collectors, and sources or drains of MOS transistors are used as the emitters.

3. A transconductance amplifier as set forth in claim 1, wherein said first and second parasitic bipolar transistors are horizontal-type bipolar transistors being present in fabrication of CMOS devices, in which wells are used as the bases, sources of MOS transistors are used as the emitters, and drains of MOS transistors are used as the collectors.

4. A transconductance amplifier as set forth in claim 1, wherein said bias means further includes:
third and fourth parasitic bipolar transistors including base terminals connected respectively to connection of the source terminal of said third NMOS transistor with the drain terminal of said fifth NMOS transistor and to connection of the source terminal of said fourth NMOS transistor with the drain terminal of said sixth NMOS transistor, collector terminals connected to the voltage source terminal and emitter terminals connected respectively to the base terminals of said first and second parasitic bipolar transistors.

5. A transconductance amplifier as set forth in claim 1, wherein the drain terminals of said first and second NMOS transistors in said amplifying means are connected to the voltage source terminal, and the collector terminals of said first and second parasitic bipolar transistors in said bias means are connected to said active load, the collector terminal of said second parasitic bipolar transistor being also connected to the current output terminal.

* * * * *